(12) United States Patent
Bang et al.

(10) Patent No.: US 9,231,286 B2
(45) Date of Patent: Jan. 5, 2016

(54) PACKAGE SUBSTRATE WITH BAND STOP FILTER AND SEMICONDUCTOR PACKAGE INCLUDING THE SAME

(71) Applicant: SK hynix Inc., Icheon-si Gyeonggi-do (KR)

(72) Inventors: Byung Jun Bang, Incheon (KR); Sang Joon Lim, Icheon-si (KR); Ju Il Eom, Guri-si (KR); Bok Kyu Choi, Yongin-si (KR); Jin Hwan Song, Seoul (KR)

(73) Assignee: SK Hynix Inc., Gyeonggi-do (KR)

( * ) Notice: Subject to any disclaimer, the term of this patent is extended or adjusted under 35 U.S.C. 154(b) by 322 days.

(21) Appl. No.: 13/901,297

(22) Filed: May 23, 2013

(65) Prior Publication Data

US 2014/0176262 A1   Jun. 26, 2014

(30) Foreign Application Priority Data

Dec. 24, 2012  (KR) .................. 10-2012-0151670

(51) Int. Cl.
*H01P 1/203* (2006.01)
*H05K 1/02* (2006.01)
*H05K 1/16* (2006.01)

(52) U.S. Cl.
CPC .............. *H01P 1/2039* (2013.01); *H01P 1/203* (2013.01); *H05K 1/0236* (2013.01); *H01L 2924/0002* (2013.01); *H05K 1/16* (2013.01); *H05K 2201/09236* (2013.01); *H05K 2201/09354* (2013.01); *H05K 2201/09781* (2013.01)

(58) Field of Classification Search
CPC .............................. H01P 1/203; H01P 1/2039
USPC ................................................... 333/204, 205
See application file for complete search history.

(56) References Cited

U.S. PATENT DOCUMENTS

| 7,582,951 | B2 | 9/2009 | Zhao et al. |
| 8,085,545 | B2 | 12/2011 | Song |
| 2002/0158704 | A1* | 10/2002 | Ye ................................ 333/99 S |
| 2006/0250199 | A1* | 11/2006 | Ohwada et al. ................ 333/204 |
| 2011/0304015 | A1 | 12/2011 | Kim et al. |

FOREIGN PATENT DOCUMENTS

| JP | 2004-056441 B2 * | 2/2004 |
| KR | 1019990037427 A | 5/1999 |
| KR | 1020100045331 A | 5/2010 |
| KR | 1020110016012 A | 2/2011 |
| KR | 1020110030090 A | 3/2011 |
| KR | 1020110039448 A | 4/2011 |

OTHER PUBLICATIONS

English Translation of JP 2004056441—May 18, 2015.*

* cited by examiner

*Primary Examiner* — Stephen E Jones
(74) *Attorney, Agent, or Firm* — William Park & Associates Ltd.

(57) ABSTRACT

According to one embodiment, a semiconductor package includes a band stop filter, which includes: a transmission line pattern arranged on a package substrate; and a conductive stub pattern arranged along the transmission line pattern in a state of being separated from the transmission line pattern.

20 Claims, 7 Drawing Sheets

PACKAGE SUBSTRATE WITH BAND STOP FILTER AND SEMICONDUCTOR PACKAGE INCLUDING THE SAME

CROSS-REFERENCES TO RELATED APPLICATIONS

The present application claims priority under 35 U.S.C 119(a) to Korean Patent Application No. 10-2012-0151670 filed on Dec. 24, 2012 in the Korean Intellectual Property Office, which is incorporated herein by reference in its entirety set forth in full.

BACKGROUND

Exemplary embodiments of the present disclosure generally relate to a package substrate and a semiconductor package, and more particularly, to a package substrate with a band stop filter and a semiconductor package including the same.

In general, a semiconductor package includes a package substrate, and a semiconductor chip mounted on the package substrate. The semiconductor chip is electrically connected to the package substrate by a connection method, such as a wire bonding, a flip chip bonding, or the like, thereby receiving power, or transmitting and receiving electrical signals.

Recently, as the miniaturization, slimming, and high processing speed of a semiconductor package has been promoted, electro-magnetic interference (EMI) generated in a semiconductor package is becoming an important issue. The electro-magnetic interference means noise that an electro-magnetic wave generated in one circuit, element, or the like is transferred to another circuit, element, or the like to cause a signal malfunction.

The conventional technologies for removing such the EMI in the semiconductor package include: a method of applying a shielding can which surrounds a semiconductor chip, as disclosed in U.S. 2011/0304015; and a method of forming a shielding structure of sealing a die through the use of a cap and a lead frame, as disclosed in U.S. Pat. No. 7,582,951. In addition, as disclosed in Korea Patent Laid-Open No. 2011-0039448, there is a method of providing a conductive layer and coupling the conductive layer to a ground surface through the use of a wirebond spring.

These technologies are separately needed a structure for shielding an electromagnetic wave and a coupling unit for connecting the shielding structure with the semiconductor package. Thus, a process for manufacturing the semiconductor package is complicated and costs for manufacturing the semiconductor package increase. Therefore, research is being conducted to develop a technology capable of increasing a shielding efficiency at a relatively low cost.

SUMMARY

In an embodiment of the present disclosure, a package substrate is provided. The package substrate includes a band stop filter disposed on one surface thereof. In this case, the band stop filter includes: a transmission line pattern; and a conductive stub pattern arranged along the transmission line pattern in a state of being separated from the transmission line pattern.

In an embodiment of the present disclosure, a semiconductor package is provided. The semiconductor package includes a band stop filter, which includes: a transmission line pattern arranged on a package substrate; and a plurality of conductive stub patterns arranged along the transmission line pattern in a state of being separated from the transmission line pattern.

In an embodiment of the present disclosure, a semiconductor package is provided. The semiconductor package includes a band stop filter which is disposed along an outer boundary line on a package substrate and performs an electromagnetic shielding function. The band stop filter includes a transmission line pattern functioning as an inductor, and a plurality of conductive stub patterns functioning as a capacitor in cooperation with the transmission line pattern.

BRIEF DESCRIPTION OF THE DRAWINGS

The above and other aspects, features and other advantages will be more clearly understood from the following detailed description taken in conjunction with the accompanying drawings, in which:

FIG. 1b is an enlarged plane view of a region indicated by a reference sign "A" in FIG. 1a;

DESCRIPTION OF SPECIFIC EMBODIMENTS

Figure 1A:
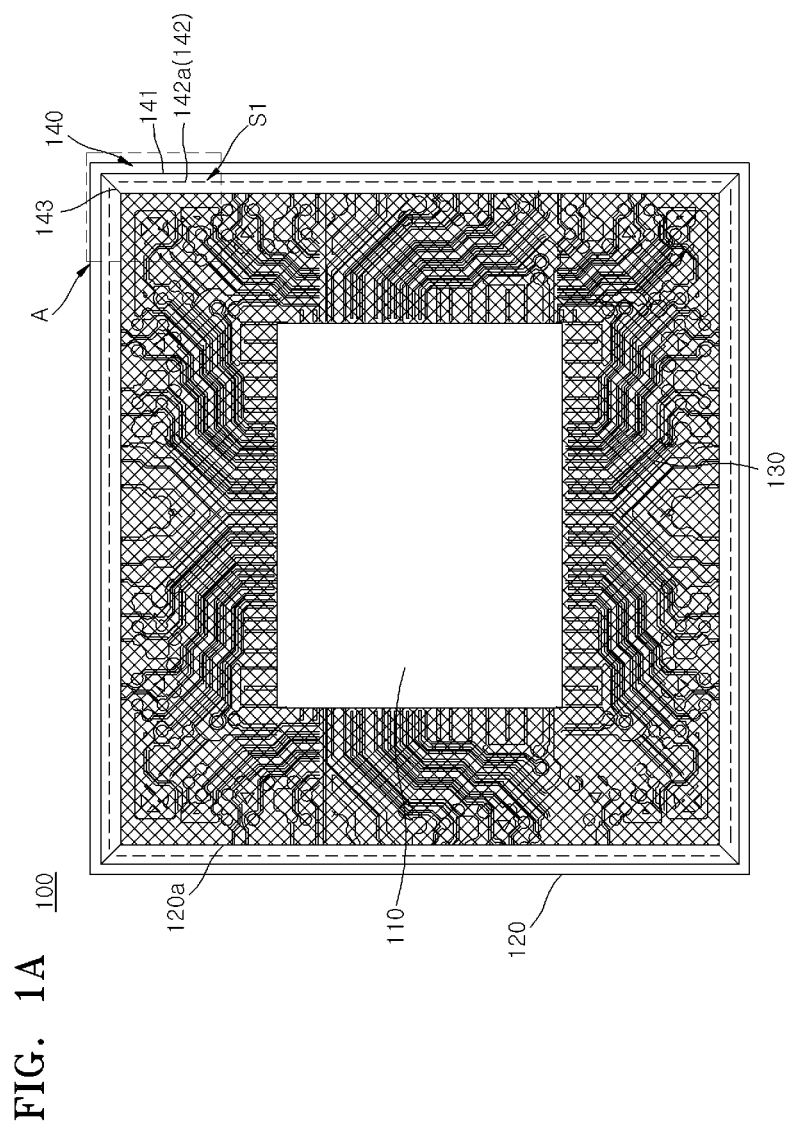
FIG. 1a is a plane view schematically illustrating a semiconductor package according to one embodiment of the present disclosure.

Hereinafter, exemplary embodiments of the present disclosure will be described in detail with reference to the accompanying drawings. The drawings are not necessarily to scale and in some instances, proportions may have been exaggerated in order to clearly illustrate features of the embodiments. The descriptions of the drawings will be based on an observer's view point. In this specification, when one component is positioned on another component, this means that the one component may be positioned directly on another component or an additional element may be interposed therebetween. In the accompanying drawings, like reference numerals denote substantially the same components. Furthermore, it should be understood that a singular expression may include plural expressions as long as they are not clearly different from each other. Furthermore, it should be understood that terms such as 'include' and 'have' just mean that a feature, a number, a step, an operation, a part, or a combination thereof exists, and do not exclude the existence or addition of one or more features, numbers, steps, operations, parts, or combinations thereof.

Figure 1B:
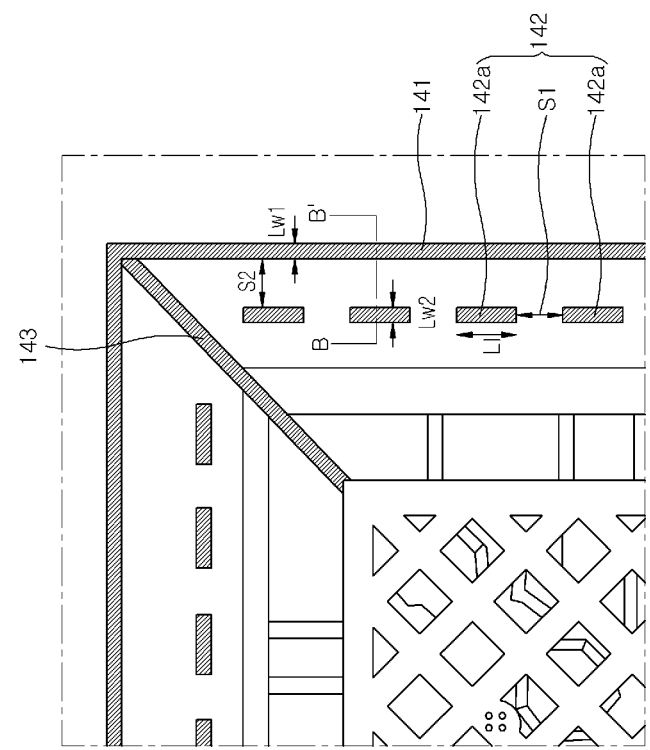
Figure 1C:
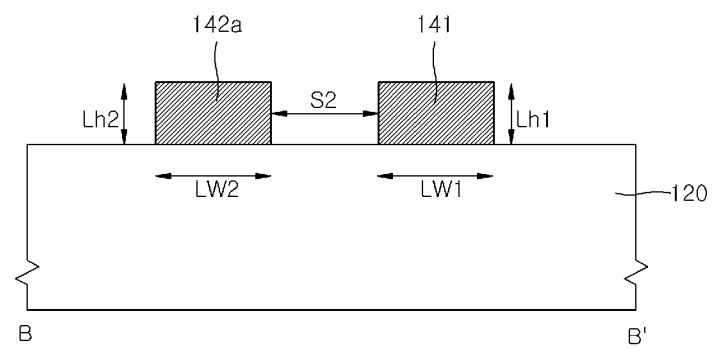
FIG. 1c is a cross-sectional view taken along the B-B0 line in FIG. 1b.

Referring to FIGS. 1a to 1c, a semiconductor package 100 may include a semiconductor chip 100, and a package substrate 120 on which the semiconductor chip 100 may be mounted. The package substrate 120 may include an integrated circuit 130. The integrated circuit 130 may include a plurality of signal lines, for example, power lines, ground lines, and address signal lines. The integrated circuit 130 may include, for example, an active element or a passive element. A part of the integrated circuit 130 maybe electrically connected to the semiconductor chip 100 by a coupling structure, such as a wire bonding or a flip chip bonding. Such the package substrate 120 may be called a printed circuit board.

The semiconductor package 100 may include a band stop filter 140. The band stop filter 140 may include a function of shielding an electromagnetic wave generated from the semiconductor package 100. The band stop filter 140 may be formed on the package substrate 120, the band stop filter 140 may include a transmission line pattern 141 and a conductive stub pattern 142 which are disposed on one surface of the package substrate 120. In an embodiment, the band stop filter 140 may be implemented on the package substrate 120. In this case, the band stop filter 140 may be a part of the substrate 120.

The conductive stub pattern 142 may be arranged along the transmission line pattern 141 in a state of being separated from the transmission line pattern 141. The transmission line pattern 141 may be an inductor element of the band stop filter 140, and the conductive stub pattern 142 may be a capacitor element of the band stop filter 140 in cooperation with the transmission line pattern 141.

According to one embodiment, the transmission line pattern 141 and the conductive stub pattern 142 may be disposed on the same plane of the package substrate 120. The transmission line pattern 141 may have predetermined line width Lw1 and height Lh1. The line width Lw1 and height Lh1 of the transmission line pattern 141 may be determined on the basis of a frequency band of the electromagnetic wave which is to be shielded.

The conductive stub pattern 142 may include a plurality of sub-pattern units 142a which are physically and electrically isolated from each other. According to one embodiment, each of the sub-pattern units 142a may have predetermined line width Lw2, length LI, and height Lh2. The sub-pattern units 142a may be spaced apart by a predetermined interval S1 from each other. The line width Lw2, length LI, height Lh2, and interval S1 of the sub-pattern units 142a can be determined on the basis of a frequency band of the electromagnetic wave which is to be shielded.

Referring to FIGS. 1a to 1c, the transmission line pattern 141 may be disposed in an edge region of the package substrate 120, and the conductive stub patterns 142 may be disposed in a region adjacent to the transmission line pattern 141. The conductive stub patterns 142 may be arranged together with the transmission line pattern 141 along the arrangement direction of the transmission line pattern 141. The transmission line pattern 141 and the conductive stub pattern 142 may be arranged while maintaining a predetermined interval S2. The interval S2 between the transmission line pattern 141 and the conductive stub pattern 142 may be determined on the basis of a frequency band of the electromagnetic wave which is to be shielded.

According to one embodiment, the transmission line pattern 141 may be disposed in the form of a closed polygon along an outer boundary line 120a of the package substrate 120. The conductive stub pattern 142 may be disposed inside the closed polygon. The outer boundary line 120a may mean the boundary line of an outermost periphery part of a region, on which the integrated circuit 130 is disposed, in the package substrate 120, as illustrated in FIG. 1a. That is, the outer boundary line 120 may be an outer edge area of the integrated circuit 130. For example, the outer boundary line 120a may have the form of a rectangular.

Figure 1D:
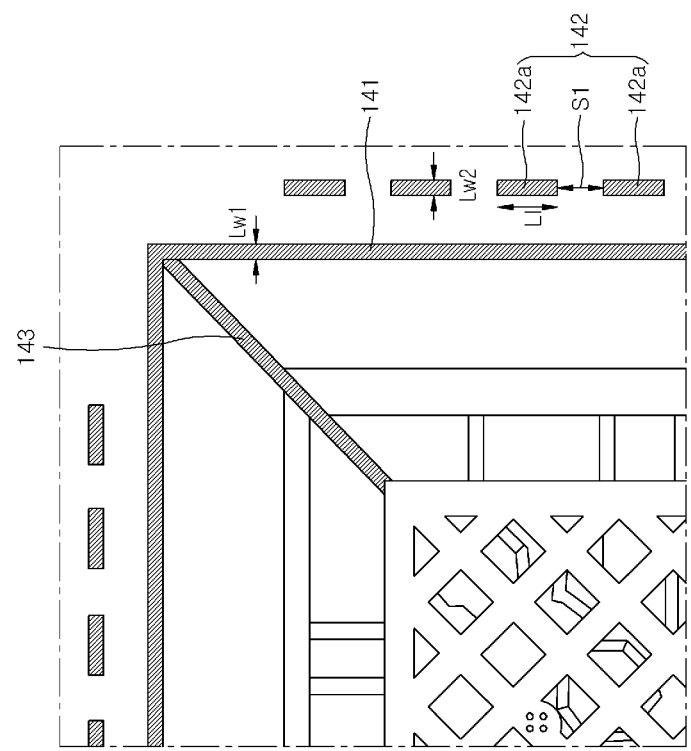
FIG. 1d is a plane view schematically illustrating a semiconductor package according to another embodiment of the present disclosure.

Further, referring to FIG. 1d, the transmission line pattern 141 may be disposed in the form of a closed polygon along an outer boundary line 120a of the package substrate 120, and the conductive stub pattern 142 may be disposed outside the closed polygon.

The transmission line pattern 141 may be electrically grounded. The ground line 143 may be disposed on the package substrate 120 so as to electrically connect the transmission line pattern 141 to a ground terminal (not shown) of the package substrate 120. Further, the ground line 143 may be disposed in the package substrate 120, and the ground line 143 and the transmission line pattern 141 may be coupled to a ground terminal of the package substrate 120 through an internal interconnection layer, which includes a via contact and the like. In case, the transmission line pattern 141 may be electrically connected to the ground line 143 or the ground terminal, the conductive stub pattern 142 can be electrically floating.

The transmission line pattern 141 and the conductive stub pattern 142 may be formed by a plating method, a printing method, a deposition method, or the like. A process of manufacturing the transmission line pattern 141 and the conductive stub pattern 142 may be performed as a separate following process after a conventional package manufacturing process has been completed, or may be performed together while a manufacturing process, e.g. a planting process, of the conventional package manufacturing process is being performed.

Although the description is not necessarily limited to a specific theory, an electromagnetic wave generated from an integrated circuit or electronic elements densely aggregating in the semiconductor package 100 may include an electric-field component which is propagated along a surface parallel to a surface of the package substrate 120, and an magnetic-field component which is propagated in a direction perpendicular to that of the electric-field component. In this case, the electric-field component and the magnetic-field component in the electromagnetic wave are in an inseparable relation. Therefore, when the electric-field component is effectively removed, the magnetic-field component may also be removed together with the electric-field component. One embodiment of the present disclosure may be configured to effectively remove the electric-field component using the band stop filter 140 which is disposed on the package substrate 120, thereby efficiently shielding the electromagnetic wave generated in the semiconductor package 100.

The band stop filter 140 may be a circuit element formed to include an inductor element and a capacitor element. The transmission line pattern 141 may function as an inductor element, while the conductive stub pattern 142 may function as a capacitor element in cooperation with the transmission line pattern 141. A shielding frequency band of the band stop filter 140 for removing the electromagnetic wave may be determined by an inductance of the transmission line pattern 141 having a function of the inductor, a capacitance between the sub-pattern units 142 of the conductive stub pattern 142 and/or a capacitance between the transmission line pattern 141 and conductive stub pattern 142. The shielding frequency band of the band stop filter 140 may be determined by the aforementioned elements, taken alone or in combination.

In detail, the inductance of the transmission line pattern 141 can be determined, for example, on the basis of the length, line width Lw1, height Lh1, and the like of the transmission line pattern 141. The capacitance between the sub-pattern units 142 of the conductive stub patterns 142 may be determined, for example, on the basis of the line width Lw2, length L1, height Lh2, interval S1 of the sub-pattern units 142a, or on the basis of a dielectric constant of a dielectric located between the sub-pattern units 142a. The capacitance between the transmission line pattern 141 and the conductive stub pattern 142 may be determined, for example, on the basis of the interval S2 between the transmission line pattern 141 and the conductive stub pattern 142, the length L1 of the conductive stub pattern 142, or the dielectric constant of a dielectric located between the transmission line pattern 141 and the conductive stub pattern 142. According to one embodiment, the shielding frequency band of the band stop filter 140 may be determined as following equation 1 with the aforementioned inductance and capacitance:

$$f = a \frac{1}{2\pi\sqrt{LC}} \quad (1)$$

(wherein f: shielding frequency, a: proportionality constant, L: inductance of inductor element in band stop filter, and C: capacitance of capacitor element in band stop filter).

The shielding frequency band of the band stop filter 140 may include a predetermined shielding frequency bandwidth, centering on a calculated shielding frequency f.

As described above, according to one embodiment of the present disclosure, an electromagnetic wave shielding function can be achieved by disposing a transmission line pattern and a conductive stub pattern on a package substrate, without a separate inductor element or separate capacitor element mounted thereon. Therefore, it is possible to simplify elements and the structure. For example, it is possible to more efficiently remove an electromagnetic wave component, which is generated in a semiconductor package, is conducted to an outer portion of a package substrate, and then is radiated to the outside. Further, since a separate inductor element and a separate capacitor element are not mounted, there is an advantage in terms of power consumption.

Hereinafter, detailed embodiments will be disclosed to more expressly express the configuration according to one embodiment of the present disclosure. However, the concept of the present disclosure is not necessarily limited to the following embodiments.

EXAMPLE

Figure 2A:
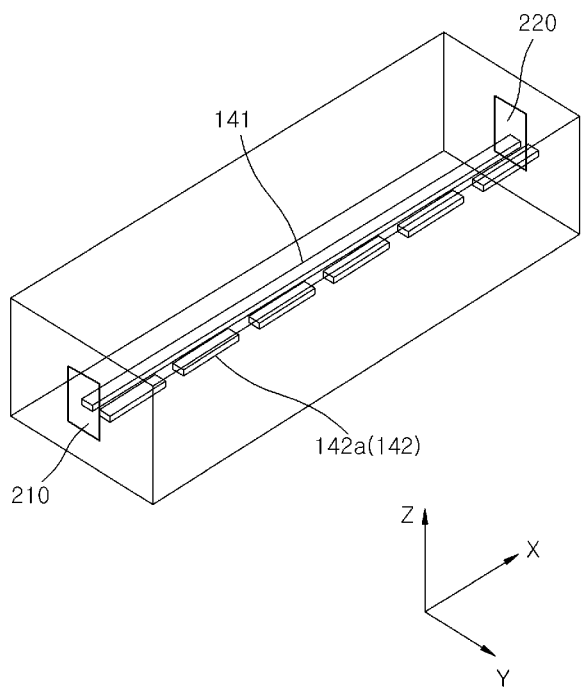
FIG. 2a is a perspective view schematically illustrating a sample of a band stop filter according to one embodiment of the present disclosure.
Figure 2B:
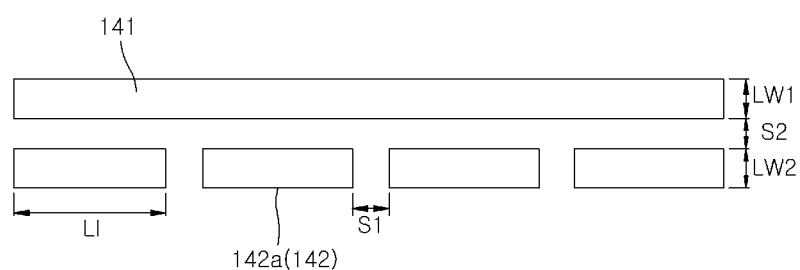
FIG. 2b is a plane view schematically illustrating a part of the sample of the band stop filter according to one embodiment of the present disclosure.

A simulation was performed in terms of an electromagnetic wave shielding capability of a band stop filter according to one embodiment of the present disclosure. As illustrated in FIGS. 2a and 2b, the transmission line pattern 141 of the band stop filter 140 was established to have a total length of 15 mm, a line width Lw1 of 40 μm, and a height of 20 μm; and each of the sub-pattern units 142a of the conductive stub pattern is established to have a length of 250 μm, a line width Lw2 of 40 μm, and a height of 20 μm. The interval S1 between the sub-pattern units 142a was established to 150 μm; and the interval S2 between the transmission line pattern 141 and the sub-pattern units 142a was established to 60 μm. The dielectric constant of a dielectric between the transmission line pattern 141 and the sub-pattern units 142a, and the dielectric constant of a dielectric between the sub-pattern units 142a were all established to four.

The simulation was performed using a commercial high-frequency structure simulator. The simulation was performed using an electromagnetic wave signal which is outputted from an output port 220 of the band stop filter when an electromagnetic wave signal of 0 Hz to 1 GHz was applied to an input port 210 of the band stop filter illustrated in FIG. 2A.

In addition, the simulation was performed in terms of energy outputted from the output port 220, in comparison of energy inputted through the input port 210, using a commercial circuit simulator.

Consideration

Figure 3:
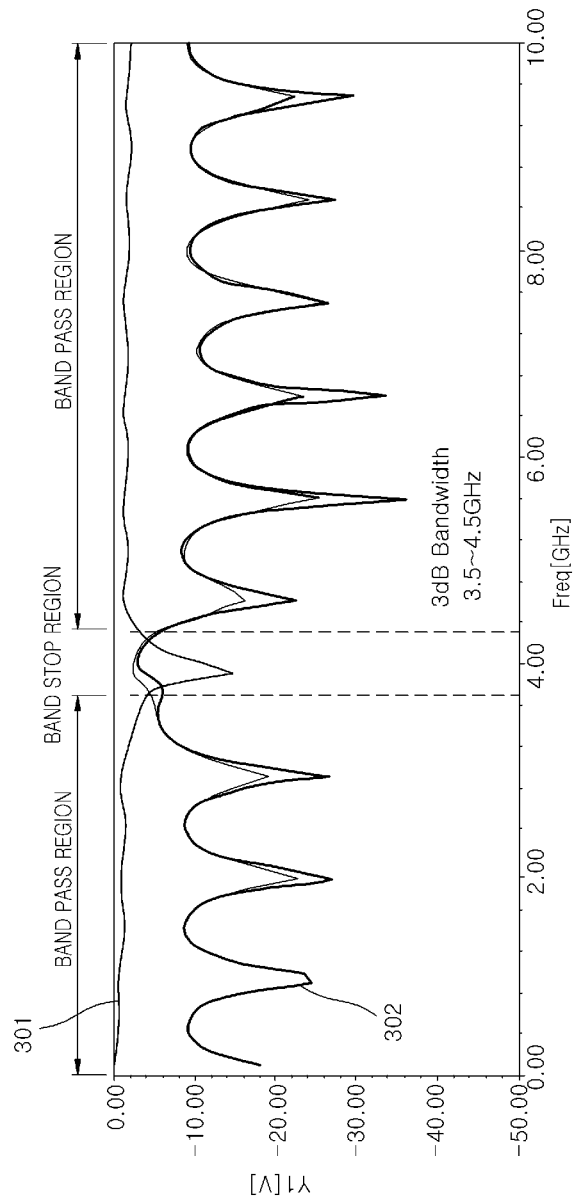
FIG. 3 illustrates a result of a simulation in terms of the electromagnetic-wave transfer characteristic and reflection characteristic of the band stop filter according to one embodiment of the present disclosure.

Referring to FIG. 3, a transfer characteristic graph 301 and a reflection characteristic graph 302 are illustrated. The transfer characteristic graph 301 shows the relative intensity of an electromagnetic wave signal, which is incidented through the input port 210, passes through the band stop filter, and then is outputted through the output port 220, with respect to a frequency domain. The reflection characteristic graph 302 shows the relative intensity of an electromagnetic wave signal, which is incidented through the input port 210, is reflected in the band stop filter 140, and then returns to the input port 210, with respect to a frequency domain.

Referring to FIG. 3, an electromagnetic wave signal shielding phenomenon in a band of 3.5 to 4.5 GHz, centering on approximately 4 GHz, was observed. That is to say, in a band of 3.5 to 4.5 GHz, the relative intensity in the transfer characteristic graph 301 shows a tendency to decrease while the relative intensity in the reflection characteristic graph 302 shows a tendency to increase.

Figure 4:
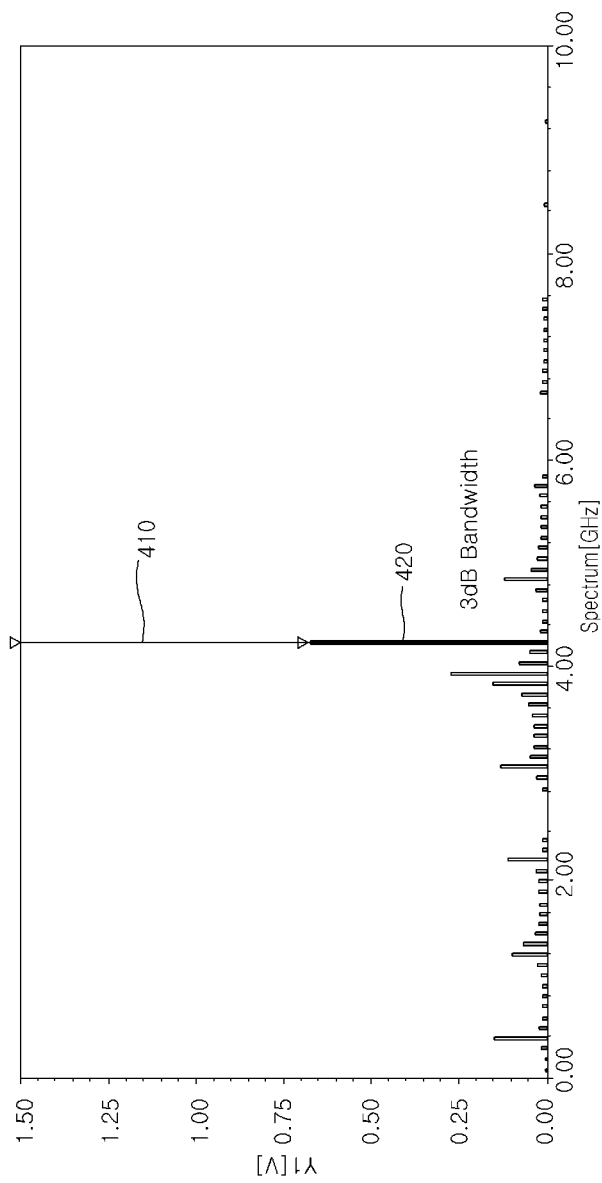
FIG. 4 illustrates a result of a simulation of the energy transfer characteristic of the band stop filter according to one embodiment of the present disclosure.

The energy transfer characteristic was been obtained through a simulation of the ratio of energy outputted through the output port 220 to energy incidented through the input port 210. Referring to FIG. 4, it is shown that, of electromagnetic wave energy 410 of approximately a 4 GHz band which is incidented through the input port 210, energy 420 of 45% was outputted through the output port 220. That is to say, it can be understood that the band stop filter shielded approximately 55% of incident electromagnetic wave energy of approximately a 4 GHz band.

The frequency of approximately a 4 GHz band wherein the electromagnetic wave shielding characteristic was observed in the aforementioned graphs of FIGS. 3 and 4 can be derived from the configuration of the band stop filter and equation 1 which are aforementioned in connection with FIGS. 2a and 2b.

According to one embodiment, the band stop filter includes a transmission line pattern disposed on a package substrate, and a conductive stub pattern corresponding to the transmission line pattern. Since the band stop filter can be implemented by a pattern formed on the package substrate, it is possible to omit a separate inductor element and capacitor element mounted on the package substrate in order to shield an electromagnetic wave.

The embodiments of the present disclosure have been disclosed above for illustrative purposes. Those skilled in the art will appreciate that various modifications, additions and substitutions are possible, without departing from the scope and spirit of the disclosure as disclosed in the accompanying claims.

What is claimed is:

1. A package substrate, comprising a band stop filter which comprises:
    a transmission line pattern disposed along an outer boundary line on the package substrate; and
    a conductive stub pattern arranged along the transmission line pattern, wherein the conductive stub pattern is separated from the transmission line pattern.

2. The package substrate of claim 1, wherein the transmission line pattern and the conductive stub pattern are arranged while maintaining a uniform interval therebetween.

3. The package substrate of claim 1, wherein the transmission line pattern is configured to be electrically grounded, and the conductive stub pattern is configured to be electrically floating.

4. The package substrate of claim 1, wherein the transmission line pattern is configured to function as an inductor element of the band stop filter, and the conductive stub pattern is configured to function as a capacitor element of the band stop filter with the transmission line pattern.

5. The package substrate of claim 1, wherein the conductive stub pattern comprises a plurality of sub-pattern units configured to be physically and electrically isolated from each other, wherein each of the plurality of sub-pattern units is configured to have a uniform line width and length.

6. The package substrate of claim 5, wherein the plurality of sub-pattern units are arranged to be spaced by a uniform interval from each other.

7. A semiconductor package comprising a band stop filter which comprises:
 a transmission line pattern configured to be arranged on a package substrate, wherein the transmission line pattern is disposed in the form of a closed polygon along an outer boundary line of the package substrate; and
 a conductive stub pattern configured to be arranged along the transmission line pattern, wherein the conductive stub pattern is separated from the transmission line pattern.

8. The semiconductor package of claim 7, wherein the transmission line pattern and the conductive stub pattern are disposed on a same plane of the package substrate.

9. The semiconductor package of claim 7, wherein the transmission line pattern and the conductive stub pattern are arranged while maintaining a uniform interval therebetween.

10. The semiconductor package of claim 7, wherein the conductive stub pattern is disposed inside the closed polygon.

11. The semiconductor package of claim 7, wherein the conductive stub pattern is disposed outside the closed polygon.

12. The semiconductor package of claim 7, wherein the conductive stub pattern comprises a plurality of sub-pattern units configured to be physically and electrically isolated from each other, wherein each of the plurality of sub-pattern units is configured to have a uniform line width and length.

13. The semiconductor package of claim 12, wherein the plurality of sub-pattern units are arranged to be spaced by a uniform interval from each other.

14. The semiconductor package of claim 7, wherein the transmission line pattern is configured to be electrically grounded, and the conductive stub pattern is configured to be electrically floating.

15. The semiconductor package of claim 14, wherein the transmission line pattern is configured to be electrically connected to a ground line of the package substrate.

16. The semiconductor package of claim 7, wherein the transmission line pattern is configured to function as an inductor element of the band stop filter, and the conductive stub pattern is configured to function as a capacitor element of the band stop filter with the transmission line pattern.

17. The semiconductor package of claim 16, wherein a shielding frequency band of the band stop filter is determined by at least one among:
 an inductance of the transmission line pattern;
 a capacitance of the conductive stub pattern; and
 a capacitance between the transmission line pattern and the conductive stub pattern.

18. A semiconductor package comprising a band stop filter configured to be disposed along an outer boundary line on a package substrate and to perform an electromagnetic shielding function,
 wherein the band stop filter comprises a transmission line pattern configured to function as an inductor element, and a conductive stub pattern configured to function as a capacitor element with the transmission line pattern.

19. The semiconductor package of claim 18, wherein the transmission line pattern is configured to be electrically grounded, and the conductive stub pattern is configured to be electrically floating.

20. The semiconductor package of claim 18, wherein a shielding frequency band of the band stop filter is determined by at least one among:
 an inductance of the transmission line pattern;
 a capacitance of the conductive stub pattern; and
 a capacitance between the transmission line pattern and the conductive stub pattern.

* * * * *